United States Patent [19]

Tanaka et al.

[11] Patent Number: 5,076,864

[45] Date of Patent: Dec. 31, 1991

[54] PROCESS FOR PRODUCING MULTILAYER PRINTED WIRING BOARD

[75] Inventors: Yasuo Tanaka; Naohito Yoshimura; Koichi Nakano; Touru Nohtomi; Morio Gaku, all of Tokyo, Japan

[73] Assignee: Mitsubishi Gas Chemical Company, Inc., Tokyo, Japan

[21] Appl. No.: 403,519

[22] Filed: Sep. 6, 1989

[30] Foreign Application Priority Data

Sep. 6, 1988 [JP] Japan ............................. 63-221373
Sep. 6, 1988 [JP] Japan ............................. 63-221374
Nov. 10, 1988 [JP] Japan ............................. 63-282364

[51] Int. Cl.⁵ ............................................. H05K 1/00
[52] U.S. Cl. .................................. 148/269; 148/272; 427/97
[58] Field of Search ................... 148/272, 269; 427/97

[56] References Cited

U.S. PATENT DOCUMENTS 4,775,444  10/1988  Cordani ............................. 427/97

FOREIGN PATENT DOCUMENTS 0189913  8/1986  European Pat. Off.
WO87/02856  5/1987  PCT Int'l Appl.

Primary Examiner—Sam Silverberg
Attorney, Agent, or Firm—Browdy and Neimark

[57] ABSTRACT

A process for producing a multilayer printed wiring board, characterized in that copper surface of internal layer(s) is chemically oxidized, thereby forming a brown or black, oxidized copper surface on the internal layer board; and said oxidized copper surface of said internal layer board is treated with an acidic aqueous solution of a reducing agent containing at least one material selected from the group consisting of zinc formaldehyde sulfoxylate and sodium hypophosphite.

6 Claims, No Drawings

5,076,864

PROCESS FOR PRODUCING MULTILAYER PRINTED WIRING BOARD

FIELD OF THE INVENTION

This invention relates to a process for producing a multilayer printed wiring board, characterized by treating a copper surface of an internal layer board by a specific method. In particular, this invention relates to a process for producing a multilayer printed wiring board which can strikingly reduce or completely prevent "Haloing" phenomenon or "Pink Ring" phenomenon which are caused by the dissolution of exposed, oxidized copper from the through-hole by the action of an acidic aqueous solution.

BACKGROUND OF THE INVENTION

The prior methods for improving interlaminar peel strength in the production of multilayer printed wiring boards with an internal layer are comprised in the following:

(i) Method comprising the use of copper foil which has previously been made uneven;

(ii) Method comprising forming a printed wiring on a copper-clad laminate having a gloss surface, followed by treating the copper surface with an alkaline oxidizing solution, thereby forming a brown or black oxidized copper membrane; and (iii) Method comprising forming a printed wiring on a copper-clad laminate having a gloss surface, followed by treating the copper surface with a silane coupling agent or an organic titanate coupling agent.

In order to improve these prior methods, a method comprising forming a printed circuit on a copper-clad laminate having a gloss surface, followed by treating the copper surface with an alkaline oxidizing solution, thereby forming a brown or black oxidized copper membrane has recently been used from view points of economy and adhesion properties. However, oxidized copper membrane, namely cupric oxide formed by this method is likely to be dissolved in an acidic aqueous solution, such as a hydrochloric acid solution or a sulfuric acid solution.

In general, multilayer printed wiring board was subjected to a treatment, such as, after drilling small holes, through-hole plating, electroless plating, or electroless plating, followed by electro-plating. When the above-mentioned prior method is applied to the printed board in order to improve the adhesion properties, the exposed oxidized copper in the through-holes tends to be dissolved by the acidic aqueous solution during the plating. This causes the formation of "Haloing" or "Pink Ring". These phenomena lower the reliability of the insulating printed circuit board.

A method which comprises treating the copper surface of the printed circuit board with an alkaline reducing aqueous solution which tends to be generated in the brown or black oxidized copper has been known for preventing "Haloing" or "Pink Ring" [refer to Japanese Patent Publication (KOKAI) No. 153797/1981]. Though this method exhibits adhesion properties of the copper surface which are available in practical operation, the effect for preventing "Haloing" depends on the case-by-case. Therefore, this method is not pratically used.

SUMMARY OF THE INVENTION

The present inventors conducted extensive research on the chemical oxidation of the copper surface of an internal layer board in which "Haloing" can be prevented. Unexpectedly, we have found that an acidic aqueous solution of a reducing agent instead of a basic aqueous solution of a reducing agent is effective for preventation of "Haloing". This invention is based on this discovery.

This invention relates to a process for producing a multilayer printed wiring board, characterized in that copper surface of internal layer(s) is chemically oxidized, thereby forming a brown or black, oxidized copper surface on the internal layer board; and said oxidized copper surface of said internal layer board is treated with an acidic aqueous solution of a reducing agent containing at least one material selected from the group consisting of zinc formaldehyde sulfoxylate and sodium hypophosphite.

Preferably embodiments of this invention are as follows:

(1) The acidic aqueous solution of the reducing agent has a zinc formaldehyde sulfoxylate concentration of 5–30 g/l and a pH of not less than 1 and less than 7, and the treatment is carried out at a temperature of 40°–80° C. for 0.5–5 minutes.

(2) The acidic aqueous solution of the reducing agent has a sodium hypophosphite concentration of 5–300 g/l and a pH of not less than 1 and less than 7, and the treatment is carried out at a temperature of 40°–80° C. for 0.5–5 minutes.

(3) The acidic aqueous solution of the reducing agent contains sodium hypophosphite and at least one of an inorganic or organic copper salt, and the aqueous solution has a sodium hypophosphite concentration of 5–300 g/l and a copper salt of inorganic or organic concentration of 0.1–200 g/l, and a pH of not less than 1 and less than 7 and the treatment is carried out at a temperature of 40°–80° C. for 0.5–5 minutes.

The brown or black oxidized copper membrane mainly comprises cupric oxide membrane. The "Haloing" or "Pink Ring" phenomena are caused by the dissolution of the cupric oxide into the acidic aqueous solutions which are used in the washing operation of the through-hole or the through-hole plating. When the acidic aqueous solution of the reducing agent is used according to the present invention, the problem that the brown or black copper oxide membrane mainly comprising cupric oxide is dissolved into the treating solution is not caused. Therefore, the present invention not only exhibits adhesion properties of the copper surface which are usable in a usual operation, but can also prevent the generation of "Haloing" or "Pink Ring" to a considerable extent or completely.

DETAILED DESCRIPTION OF THE INVENTION

It is critical that an internal layer board having a printed circuit formed of copper, in which the copper surface thereof is chemically oxidized to form a brown or black oxidized copper surface, followed by treating the oxidized copper surface with an acidic aqueous solution of a reducing agent containing at least one material selected from the group consisting of zinc formaldehyde and sodium hypophosphite, is used as one of the materials constituting the multilayer printed wiring board of this invention. Materials other than the above-mentioned internal layer board are optional as materials constituting the multilayer printed wiring board. For example, internal layer boards which are used for multilayer lamination; prepregs for forming outer layer; prepregs for multilayer adhesion; laminate materials such as copper foil or single copper-clad laminates; and the other known boards can be used as materials constituting the multilayer printed wiring board. Methods for laminating these materials are known.

The materials which can be used for laminating the internal layer boards which have been treated according to the present invention include (A) prepregs obtained from (i) a reinforcing material or a base material such as glass woven fabrics formed of E-glass, D-glass, S-glass, or silica glass; inorganic woven fabrics, alumina paper, aramid fabric, polyimide fabric, fluorinated resin fabric, polyphenylene sulfide fabric, polyether ether ketone fabric, polyether imide fabric or the other thermal ultra-resistant resin fabrics; woven fabrics obtained from the composite threads of the above inorganic fibers and the thermal ultraresistant resin fibers; or mixtures thereof, and (ii) a matrix resin such as epoxy resins, such as bisphenol A type epoxy resins, novolak type epoxy resins, halogenated bisphenol A type epoxy resins, halogenated novolak type epoxy resins, or polyfunctional epoxy compounds having functionality of at least 3; cyanate ester resins such as cyanate resins, cyanate ester-epoxy resins or cyanate ester maleimide-epoxy resins; maleimide resins mainly comprising a polyfunctional maleimide such as bismaleimide and a polyfunctional amide such as bis(4-aminophenol)methane; thermal resistant thermoplastic resins or mixtures of a thermoplastic resin and a thermosetting resin; (B) a copper foil such as electrolytic copper foil or a rolled copper foil; (C) a double-sided or single-sided copper-clad laminate of a copper foil and a prepreg; and (D) a printed circuit board for internal layer in which a printed circuit is formed on the double-sided or single-sided copper-clad laminate.

Heat platen press, heat platen vacuum press and autoclave press can be used for the lamination.

Method for forming a brown or black oxidized copper surface on an internal layer board have been known. Usually, the method comprises: a step of abrading the copper surface of the internal layer board and washing it; a step of pre-etching (soft etching) the copper surface with an aqueous solution of copper chloride or ammonium persulfate; and a step of treating the copper surface with an aqueous solution of an alkaline oxidizing agent. Examples of the alkaline oxidizing aqueous solutions and the conditions therefor are as follows:

(1) an aqueous solution containing sodium hydroxide (15 g/l), sodium chlorite ($NaClO_2$) (31 g/l) and sodium phosphate (15 g/l), 70°-100° C. for 0.5-10 minutes;

(2) an aqueous solution containing copper sulfate (50 g/l) and sodium chloride (200 g/l), 40°-80° C. for 3-15 minutes;

(3) an aqueous solution containing acetic acid (20 g/l), ammonium chloride (20 g/l) and copper acetate (10 g/l), 30°-80° C. for 1-10 minutes;

(4) an aqueous solution containing copper acetate (10 g/l), copper sulfate (24 g/l), barium sulfide (24 g/l) and ammonium chloride (24 g/l), 40°-50° C. for 1-10 minutes;

(5) an aqueous solution of copper sulfate (25 g/l), nickel sulfate (25 g/l) and potassium chlorate (25 g/l), 70°-90° C. for 1-10 minutes; and (6) an aqueous solution containing potassium persulfate (20 g/l) and sodium hydroxide (50 g/l), 50°-80° C. for 1-3 minutes.

After the copper surface of an internal layer board is chemically oxidized for forming a brown or black oxidized copper surface, the oxidized copper surface is cleaned and is treated with an aqueous solution containing (1) zinc formaldehyde sulfoxylate, (2) sodium hypophosphite or (3) sodium hypophosphite and a copper salt of an organic or inorganic acid, and optionally an agent for adjusting pH, washed with water and dried, thereby preventing the generation of "Haloing" to a considerable extent or completely.

(i) The acidic aqueous solution of the reducing agent containing zinc formaldehyde sulfoxylate ($ZnSO_2 \cdot CH_2O \cdot 2H_2O$) has a zinc formaldehyde sulfoxylate concentration of 5-30 g/l, preferably 5-20 g/l and a pH of not less than 1 and less than 7, preferably 2-5. The solution is used at 40°-80° C. for 0.5-5 minutes.

(ii) The acidic aqueous solution of the reducing agent containing sodium hypophosphite ($NaH_2PO_2$) has a sodium hypophosphite concentration of 5-300 g/l, preferably 10-100 g/l and a pH of not less than 1 and less than 7, preferably 2-5. The solution is used at 40°-80° C. for 0.5-5 minutes.

(iii) The acidic aqueous solution of the reducing agent containing sodium hypophosphite and a copper salt of an organic or inorganic acid has a sodium hypophosphite concentration of 5-300 g/l, preferably 10-100 g/l, a copper salt of an inorganic or organic acid concentration of 0.1-200 g/l, preferably 1-50 g/l and a pH of not less than 1 and less than 7, preferably 2-5. The solution is used at 40°-80° C. for 0.5-5 minutes.

The copper salts of organic or inorganic acid include copper salts of inorganic acids such as copper chloride and copper sulfate and copper salts of organic acids such as copper formate, or copper acetate.

An agent for adjusting pH is optionally used. Examples of the agents include organic acids such as formic acid and acetic acid. The agent is used in an amount of 1-50 ml/l. An additive such as an alcohol may be added to the acidic reducing solution of this invention.

After the copper surface of the internal layer board is treated as mentioned above, it is washed with water, air-dried and heated (particularly at a temperature of 80°-200° C.) according to the known method.

This invention is further explained by way of the following non-limiting examples. All parts and percentages are on a weight basis, unless specified as otherwise.

EXAMPLE 1

A double-sided copper-clad glass epoxy laminate (thickness of laminate is 0.8 mm and thickness of copper foil is 70 μm) was prepared. About half of the double copper layer was removed by a known etching method. The copper surface of the laminate was chemically oxidized with an aqueous solution containing sodium hydroxide (15 g/l), sodium chlorite (31 g/l) and sodium phosphate (15 g/l) at 90° C. for 5 minutes to form a brown or black oxidized copper surface and washed with water. The resulting brown or black oxidized copper surface of the laminate was treated with an aqueous solution containing zinc formaldehyde sulfoxylate ($ZnSO_2 \cdot CH_2O \cdot 2H_2O$) (10 g/l) and acetic acid (10 ml/l) having a pH of 3-4 at 80° C. for 1.5 minutes and was sufficiently washed with water and dried at 130° C. for 30 minutes to obtain the internal layer board.

Three sheets of glass-epoxy prepreg (resin content of 52% and thickness of 0.1 mm) and electrolytic copper foil thick 18 μm were stacked on each of the both sides of the resulting internal layer board. All layers were laminate-molded at 175° C. and 40 kg/cm$^2$ for 2 hours to obtain 4-layer board, and cooled. Thousand holes having a diameter of 0.4 mm were made through the resulting 4-ply board by a drill at 80,000 r.p.m. and 20 μm/rotation at an interval of 2.54 mm.

The 4-layer board having 1000 holes was immersed into a 4N hydrochloric acid solution for 5 minutes. Generation of "Haloing" was observed in the one fourth (125 holes) of the 5000 holes, and the length of maximum "Haloing" was measured.

The board having holes was cut into sections (5 cm × 5 cm). A section was boiled at 100° C. for 6 hours and then immersed for 30 seconds in a solder heated at 260° C.

The 4-layer board piece thus treated was through-hole-copper-plated and generation of "Haloing" was observed. The results are shown in Table 1.

EXAMPLE 2

The procedure of Example 1 was repeated except that an acidic aqueous solution containing zinc formaldehyde sulfoxylate (20 g/l) and acetic acid (20 ml/l) was used. The results are shown in Table 1.

EXAMPLE 3

The procedure of Example 1 was repeated by using the acidic reducing solution of Example 1 under such conditions that the ratio of the area to be treated to volume of the treating solution is 0.01 m$^2$/l and 10 boards were reduce-treated without replenishing the treating solution. The data in the treatment of the tenth board were measured. The results are shown in Table 1.

EXAMPLE 4 (NaH$_2$PO$_2$)

The procedure of Example 1 was repeated except that an acidic aqueous solution containing sodium chlorite (10 g/l) and acetic acid (3 ml/l) and having a pH of 3–4 was used. The results are shown in Table 1.

EXAMPLE 5 (NaH$_2$PO$_2$)

The procedure of Example 4 was repeated except that an acidic aqueous solution containing sodium hypophosphite (40 g/l) and acetic acid (10 ml/l) was used. The results are shown in Table 1.

EXAMPLE 6 (NaH$_2$PO$_2$)

The procedure of Example 4 was repeated by using the acidic reducing solution of Example 4 under such conditions that the ratio of area to be treated to volume of the treating solution is 0.01 m$^2$/l and 10 boards were treated without replenishing the treating solution. The data in the treatment of the tenth board were measured. The results are shown in Table 1.

EXAMPLE 7 (NaH$_2$PO$_2$+Cu salt)

The procedure of Example 1 was repeated except that an acidic aqueous solution containing sodium hypophosphite (30 g/l), copper sulfate (30 g/l) and acetic acid (3 ml/l) having a pH of 3–4 was used. The results are shown in Table 1.

EXAMPLE 8 (NaH$_2$PO$_2$+Cu salt)

The procedure of Example 7 was repeated except that an acidic aqueous solution containing sodium hypophosphite (50 g/l), copper sulfate (30 g/l) and acetic acid (4 ml/l) having a pH of 3–4 was used. The results are shown in Table 1.

EXAMPLE 9 (NaH$_2$PO$_2$+Cu salt)

The procedure of Example 7 was repeated by using the acidic reducing solution of Example 7 under such conditions that the ratio of area to be treated to volume of the treating solution is 0.01 m$^2$/l and 20 boards were treated without replenishing the treating solution. The data in the treatment of the twentieth board were measured. The results are shown in Table 1.

COMPARATIVE RUNS 1 AND 2

The procedures of Example 1 were repeated except that the resulting brown or black oxidized copper surface of the laminate was immersed in an alkaline aqueous reducing solution [a 30% strength formalin (30 ml/l) and KOH (38 g/l)] at 75° C. for 15 minutes (Comparative Run 1) or an alkaline aqueous reducing solution containing sodium hypophosphite (30 g/l) and NaOH (5 g/l) at 65° C. for 10 minutes (Comparative Run 2). Though generation of "Haloing" was not observed on some of the samples, generation of "Haloing" on some of the samples as given in Table 1 was observed. The generation of "Haloing" depends on the case-by-case. The results are shown in Table 1.

TABLE 1

| | Reducing solution | | "Haloing" (μm) max. | | interlaminar peel strength (kg/cm) | solder resistance |
|---|---|---|---|---|---|---|
| | reducing agent | (pH) | 4N HCl | through-hole | | |
| Ex. 1 | ZnSO$_2$.CH$_2$O.2H$_2$O | 3–4 | 0 | 0 | 1.2 | no damage |
| Ex. 2 | " | " | 0 | 0 | 1.2 | no damage |
| Ex. 3 | " | " | 0 | 0 | 1.2 | no damage |
| Ex. 4 | NaH$_2$PO$_2$ | 3–4 | 0 | 0 | 1.2 | no damage |
| Ex. 5 | " | " | 0 | 0 | 1.2 | no damage |
| Ex. 6 | " | " | 0 | 0 | 1.2 | no damage |
| Ex. 7 | NaH$_2$PO$_2$ + Cu | 3–4 | 0 | 0 | 1.5 | no damage |
| Ex. 8 | " | " | 0 | 0 | 1.5 | no damage |

TABLE 1-continued

| | Reducing solution | | "Haloing" (μm) max | | inter-laminar peel strength (kg/cm) | solder resistance |
|---|---|---|---|---|---|---|
| | reducing agent | (pH) | 4N HCl | through-hole | | |
| Ex. 9 | " | " | 0 | 0 | 1.5 | no damage |
| Comp. Run 1 | ZnSO$_2$.CH$_2$O.2H$_2$O | alkaline pH | 100 | 80 | 1.0 | — |
| Comp. Run 2 | NaH$_2$PO$_2$ | alkaline pH | 150 | 100 | 1.0 | — |

EXAMPLES 10-12

The procedures of Examples 1, 4 and 7 were repeated except that a double copper-clad glass-cyanate ester-maleimide-epoxy resin laminate (trade name, HL 810, available from Mitsubishi Gas Chemical Co., Inc.) was used as an internal layer board, glass-cyanate ester-maleimide-epoxy resin prepreg (trade name, GHPL, available from Mitsubishi Gas Chemical Co., Inc.) was used as a laminate material, and the lamination was carried out at 200° C. for 2 hours. The results are shown in Table 2.

TABLE 2

| | Reducing solution | | "Haloing" (μm) max. | | inter-laminar peel strength (kg/cm) | solder resistance |
|---|---|---|---|---|---|---|
| | Reducing agent | (pH) | 4N HCl | through-hole | | |
| Ex. 10 | ZnSO$_2$.CH$_2$O.2H$_2$O | 3-4 | 0 | — | 0.9 | no damage |
| Ex. 11 | NaH$_2$PO$_2$ | " | 0 | — | 0.9 | no damage |
| Ex. 12 | NaH$_2$PO$_2$ + Cu | " | 0 | 0 | 1.1 | no damage |

When the multilayer printed wiring board prepared according to the present invention is subjected to subsequent operations, generation of "Haloing" which causes short circuit can be completely prevented or to a considerable extent. The treating time by the acidic reducing agent can be shortened to a considerable extent, and the treating solution can be used repeatedly. Therefore, the multilayer printed wiring boards having a excellent reliability can be produced at a high rate of productivity. This invention is significant from the industrial view point.

What is claimed is:

1. A process for producing a multilayer printed wiring board having at least one internal layer having a copper surface, comprising
   chemically oxidizing said copper surface of said internal layer and thereby forming a darkened oxidized copper surface on said internal layer; and
   treating said oxidized copper surface with an acidic aqueous solution of a reducing agent containing at least one material selected from the group consisting of zinc formaldehyde sulfoxylate and sodium hypophosphite.

2. The process of claim 1 wherein the acidic aqueous solution of the reducing agent has a zinc formaldehyde sulfoxylate concentration of 5-30 g/l and a pH of not less than 1 and less than 7, and the treatment is carried out at a temperature of 40°-80° C. for 0.5-5 minutes.

3. The process of claim 1 wherein the acidic aqueous solution of the reducing agent has a sodium hypophosphite concentration of 5-300 g/l and a pH of not less than 1 and less than 7, and the treatment is carried out at a temperature of 40°-80° C. for 0.5-5 minutes.

4. The process of claim 1 wherein the acidic aqueous solution of the reducing agent contains sodium hypophosphite and at least one of an copper salt of an inorganic or organic acid.

5. The process of claim 4 wherein the aqueous solution has a sodium hypophosphite concentration of 5-300 g/l and a copper salt of an inorganic or organic acid concentration of 0.1-200 g/l, and a pH of not less than 1 and less than 7 and the treatment is carried out at a temperature of 40°-80° C. for 0.5-5 minutes.

6. A process for producing a multilayer printed wiring board which comprises
   chemically oxidizing the copper surface of a printed circuit formed of copper to form a brown or black oxidized copper surface, whereby the resulting printed circuit is an internal layer board,
   stacking the resulting internal layer board or internal layer boards, prepregs and a copper foil(s) or a copper-clad laminate(s),
   carrying out heat platen pressing of the resulting multilayers, and
   further comprising treating said oxidized copper surface of said internal layer board with an acidic aqueous solution of a reducing agent containing at least one material selected from the the group consisting of zinc formaldehyde sulfoxylate with a concentration of 5-30 g/liter and sodium hypophosphite with a concentration of 5-300 g/liter and a pH of not less than 1 and less than 7, and the treatment is carried out at a temperature of 40°-80° C. for 0.5-5 minutes.

* * * * *